United States Patent [19]

Bernhardt et al.

[11] Patent Number: 5,653,019
[45] Date of Patent: Aug. 5, 1997

[54] REPAIRABLE CHIP BONDING/ INTERCONNECT PROCESS

[75] Inventors: Anthony F. Bernhardt, Berkeley; Robert J. Contolini; Vincent Malba, both of Livermore; Robert A. Riddle, Tracy, all of Calif.

[73] Assignee: Regents of the University of California, Oakland, Calif.

[21] Appl. No.: 522,471

[22] Filed: Aug. 31, 1995

[51] Int. Cl.⁶ .................................................. H05K 3/34
[52] U.S. Cl. ........................ 29/840; 257/742; 257/777; 438/618
[58] Field of Search ................... 29/840, 832; 437/187, 437/194; 257/742, 777

[56] References Cited

U.S. PATENT DOCUMENTS

| | | | |
|---|---|---|---|
| 4,609,772 | 9/1986 | Grolitzer | 437/187 X |
| 4,721,995 | 1/1988 | Tanizawa | 257/777 |
| 4,992,847 | 2/1991 | Tuckerman . | |
| 5,312,772 | 5/1994 | Yokoyama et al. | 437/194 X |
| 5,365,656 | 11/1994 | Dahringer et al. | 29/840 |
| 5,478,779 | 12/1995 | Akram | 437/187 X |

*Primary Examiner*—Carl J. Arbes
*Attorney, Agent, or Firm*—L. E. Carnahan; Henry P. Sartorio

[57] ABSTRACT

A repairable, chip-to-board interconnect process which addresses cost and testability issues in the multi-chip modules. This process can be carried out using a chip-on-sacrificial-substrate technique, involving laser processing. This process avoids the curing/solvent evolution problems encountered in prior approaches, as well is resolving prior plating problems and the requirements for fillets.

For repairable high speed chip-to-board connection, transmission lines can be formed on the sides of the chip from chip bond pads, ending in a gull wing at the bottom of the chip for subsequent solder.

19 Claims, 3 Drawing Sheets

REPAIRABLE CHIP BONDING/INTERCONNECT PROCESS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The invention relates to integrated circuit packaging, particularly to mounting of chip and formation of interconnections, and more particularly to a repairable chip bonding/interconnection process.

Various processes have been developed for the packaging of integrated circuits involving securing bare (unencapsulated) chips to a substrate and forming desired interconnects on the chips and substrate. The problems associated with the formation of lead lines or interconnects on the vertical surfaces of chips and/or substrates has been substantially reduced by a technology generally known as laser pantography or laser direct-writing, wherein the laser is rastered with computer control to form the pattern from data stored as a computer file. Thus, the laser beam can be manipulated to any appropriate surface, either horizontal, vertical or at an angle through the use of computer controlled optics and stages (either an angled beam or a tilted stage is utilized). The laser is not used simply as a light source that shines through a mask as in conventional lithography, but is focused to the required size to form the desired pattern on a chip or substrate. Various fabrication techniques using laser pantography have been recently developed by David D. Tuckerman and others, such as exampled by U.S. Pat. No. 4,992,847 issued Feb. 12, 1991.

Repairability of chip-to-board interconnection has long been a problem in the packaging of integrated circuits onto multichip modules, particularly chip-to-board interconnects which provide for testability without destruction of the chips and/or board. The present invention is directed to a resolution of this problem, and involves a repairable chip-to-board interconnect technique which addresses cost and testability issues. The invention involves a chip-on-sacrificial-substrate approach. The invention includes the formation of transmission lines from the chip to temporary board or substrate which end in gull wing interconnects at the bottom of the chip for subsequent bonding to a substrate or circuit board at a point of use. The invention provides for testability after the "gull wing" interconnects are formed, but before dissolution of the sacrificial substrate or layer, whereby the chip can be tested at speed and burned in. If good, the chip can then be removed from the sacrificial substrate and bonded to a permanent substrate.

SUMMARY OF THE INVENTION

It is an object of the present invention to provide a technique for the formation of repairable interconnections for integrated circuit interconnects.

A further object of the invention is to provide a repairable interconnection technique, whereby chips can be readily removed from a substrate and then bonded to another substrate.

Another object of the invention is to provide a repairable interconnect technique which involves a chip-to-sacrificial-substrate process.

Other objects and advantages of the invention will become apparent from the following description and accompanying drawings. The invention basically involves the formation of transmission lines or leads formed on the top or horizontal surface and the sides or vertical surfaces of the chip which end in a gull wing configuration interconnect at the bottom of the chip for subsequent solder or compression bonding to a substrate or board. The leads or lines, may if desired, be composed of coplanar transmission lines. As long as the chip or die attach and lead bonding is a repairable process (e.g. solder), the process is deemed repairable. By use of a sacrificial substrate during fabrication of the gull wing interconnects, testing can be carried out prior to removal of the chip from the sacrificial substrate.

The process of the present invention has application in electronics packaging, specifically bonding and connection of chips, particularly to bonding and connection of a single chip or chips to a board or to a multichip module for computer or flat panel display applications, for example.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
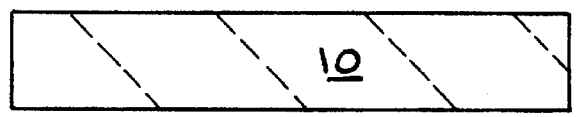
FIGS. 1–9 are cross-sectional views illustrating the processing steps carried out in a first approach for producing repairable chip bonding/interconnects using gull wings and a sacrificial substrate.
Figure 2:
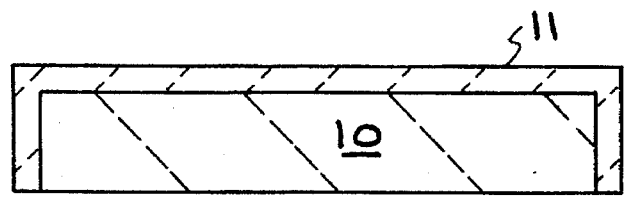
Figure 3:
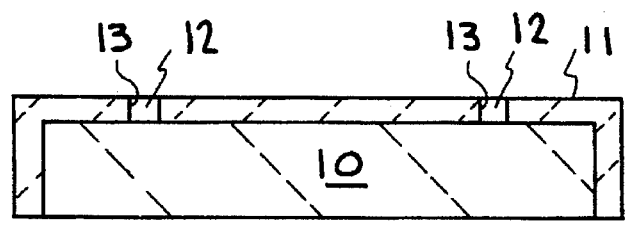
Figure 4:
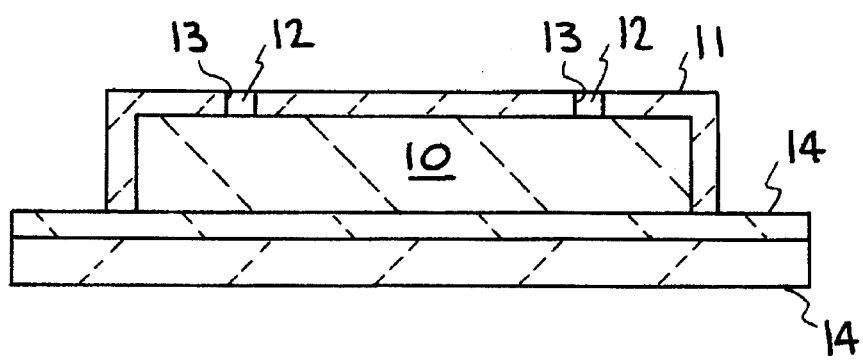
Figure 5:
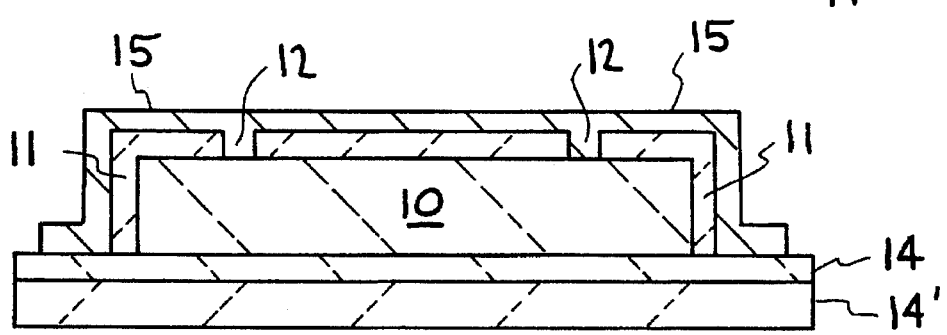

The present invention is directed to the technology of repairable chip bonding and electrical interconnections. The invention produces repairable, chip-to-board interconnect fabrication processes which involves a chip-on-sacrificial-substrate process which involves the formation of gull wing type interconnects between the chip and the board.

Repairability means that a dysfunctional chip can be removed, discarded, and replaced; or that a dysfunctional substrate can have good chips removed, and reattached to another substrate.

An interconnect or chip-to-board bonding is considered to be repairable as long as the chip (die) attach and lead bonding are carried out using a material, such as solder, thermoplastic adhesive, or Z-axis conductive adhesive or film, by which the attach or lead bonding can be removed without damage to any component. The term repairable interconnect or interconnection as used herein refers to the electrical attach or bonding between chip and board, although the term interconnect is utilized to describe the connector or line between the chip and the board or substrate.

By the present invention, repairable, high speed chip-to-board connections, such as coplanar transmission lines, can be formed on the top and sides (vertical surfaces) of the chip from chip bond pads, ending in a gull wing at the bottom of the chip for subsequent soldering or compression bonding to the board. The technique of this invention involves laser processing, generally referred to as laser pantography or direct laser writing. Such laser processing techniques for use in integrated circuit packaging is now well known, and thus a detailed description thereof is deemed unnecessary to enable one skilled in this field of technology to understand how to carry out the present invention. The above-referenced U.S. Pat. No. 4,992,847 and copending U.S. application Ser. No. 08/387,495, filed Feb. 13, 1995, entitled "3-D Laser Patterning Process", assigned to the same assignee, exemplify prior laser processing techniques.

This process can also be carried out without a laser system, by using projection lithography through a mask to produce the gull wings. However the laser processing technique is preferred.

Gull wings are associated with surface-mount printed circuit boards (PCB's). Encapsulated chips with gull wings are soldered onto PCB's. The gull wings replace DIP (double-in-line pins) packages which bond to a PCB by pushing the pins into through-holes in the PCB.

The process of this invention emulates the surface mount approach, but with bare (unencapsulated) chips, which allows a great increase in packaging density, and hence, speed.

As pointed out above, testability of the chip can be accomplished utilizing this invention, after the gull wing interconnects are formed, but before dissolution of a release layer on the sacrificial substrate, whereby the chip can be tested at speed and burned-in. If good, the chip can then be removed (dissolve release layer) and bonded to a permanent substrate.

The chip-to-sacrificial-substrate technique is described hereinafter with respect to FIGS. 1–9, wherein the gull wings are formed. This operational process is carried out by:

1. Forming a chip or die 10, as seen in FIG. 1, from a wafer, composed of silicon, gallium arsenide, or indium phosphide.

2. Passivating the chip 10 by depositing a conformal dielectric layer 11, see FIG. 2, such as $SiO_2$ on the horizontal and vertical surfaces of chip 10 by PECVD or other techniques. The layer 11 could also be composed of polyimide, silicon nitride, or parylene.

3. Forming open contacts 12 (on the chip 10,) see FIG. 3, through openings 13 in the layer 11 (e.g. use laser ablation to open chips or vies, or use lithography to pattern the openings, followed by etching of the exposed dielectric of layer 11.

4. Applying a removable release layer 14, such as a thermoplastic polymer, onto a sacrificial substrate 14' (see FIG. 4) by spin coating, knife blading, vapor depositing, or other common application method. The polymer material can be applied as a polymer solution, such as phenoxy resin in cyclohexanone, polycarbonate in chloroform, polyester in methylethyl ketone, and thoroughly dried. The polymer can be applied as a liquid polymer system, such as cyanoacrylate or epoxy, and cured, or as a hot-melt system, such as phenoxy resin or other thermoplastic material. Polymer materials should be 100% solids at the time of bonding. Otherwise trapped solvent leads to edge lifting. The release layer 14 may have a thickness of 1–25 μm. The release layer 14 can be formed of any chemically compatible soluble material, including but not limited to, adhesives, polymers and salts. For example, in addition to phenoxy resin, the soluble material may be polycarbonate, teflon, polyester and polysulfone.

5. Attaching the chip 10 to the release layer 14, (see FIG. 4).

6. Depositing an adhesion layer, not shown, for example (50Å to 1500Å) of titanium, titanium-nickel, titanium-tungsten, tantalum, tungsten, vanadium, or chromium on the layer 11.

7. Depositing a seed layer 15 on the chip 10, release layer 14 and adhesion layer, which fills or conformally coats the openings 13 in layer 14, see FIG. 5. The seed layer 15 may be composed of copper, or gold, or a mixture thereof, having a thickness of 500Å to 6000Å, and is deposited, for example by sputtering or evaporation carried out by techniques well known in the art. The seed layer 15 may be deposited by other known techniques, such as chemical vapor deposition, etc.

Figure 6:
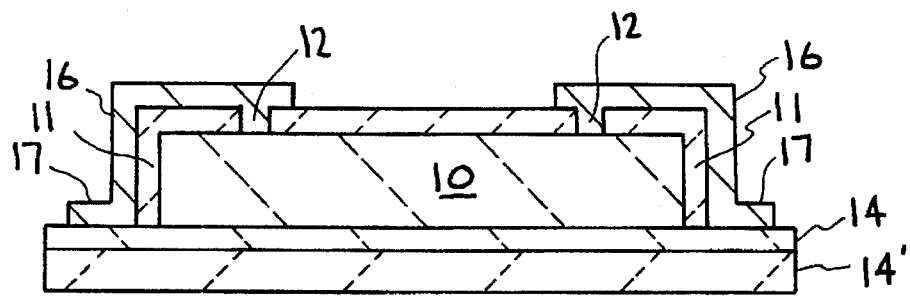

8. Forming traces or lines 16 ending in gull wings 17, and removing residual seed layer 15, as seen in FIG. 6, by an isotropically deposited photodefinable layer, such as an electrodeposited photoresist (EDPR). This is accomplished by the EDPR being plated onto the seed layer 15, then patterned with laser or conventional lithography, then developed. Copper is then plated through the mask (additive process) or etched (substractive process). Resist is removed, remaining copper seed is etched (additive process) and the adhesion layer is removed.

9. The EDPR process is described and claimed in above-referenced copending application Ser. No. 08/337,495. The EDPR may be PEPR-2400 (positive) or Eagle 2100 (negative) each made by Shipley Company. Removing the chip 10 with deposited lines 16 and gull wings 17 from the release layer 14, see FIG. 7. This may be accomplished by dissolution of the polymer release layer 14. If the layer 14 was composed of phenoxy resin, it would be dissolved by n-methylpyrolidone, cellsolve acetate, or cyclohexanone.

Figure 7:
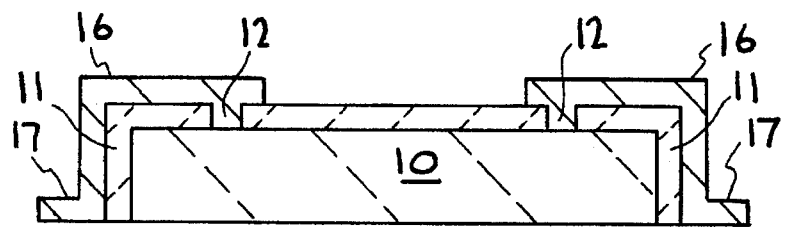
Figure 8:
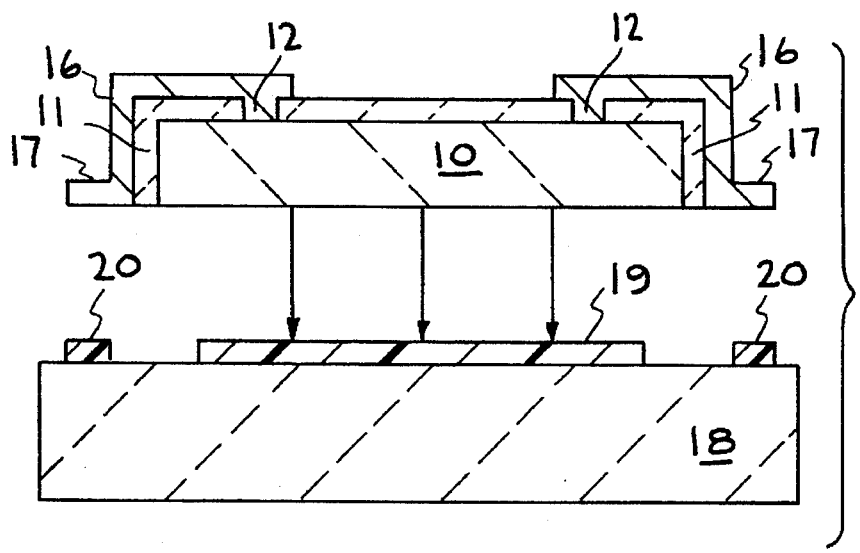
Figure 9:
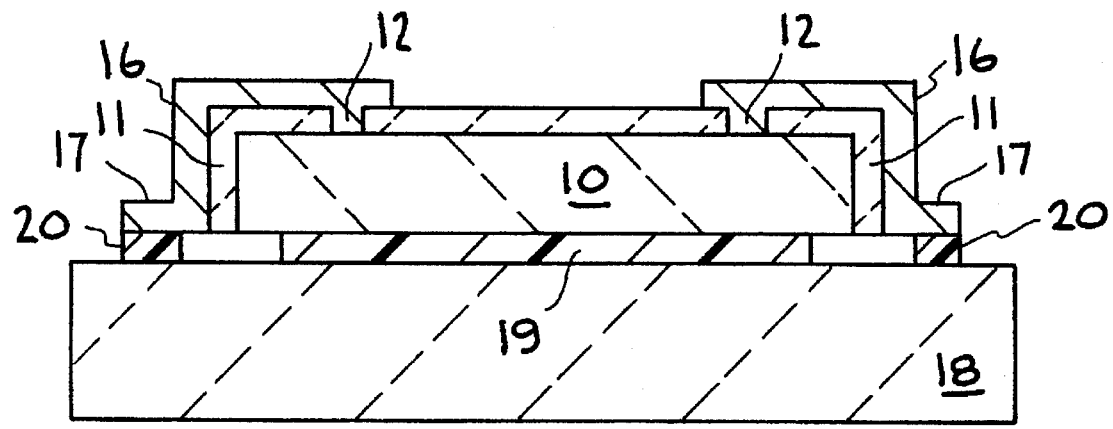

10. The chip 10 with transmission lines 16 and gull wings 17, as formed in FIG. 7, is then attached to a functional substrate or circuit board, as seen in FIGS. 8 and 9. This is accomplished by providing a substrate 18 with chip attaching material 19 and electrically conductive pads 20 to which gull wings 17 are secured. The attaching material 19 may be a solder or compression bonding material, such as a thermoplastic or dry film adhesive with a thickness of 1 μm to 50 μm; and the conductive pads 20 may be constructed of Pb/Sn or other solider, or an electrically conductive adhesive, with a thickness of 1 μm to 50 μm; and soldered, compressed etc., to gull wings 17 to enable removability and repairability, while maintaining good electrical contact. The chip attaching material can be eliminated and replaced by a thermal grease. The solder on the gull wings would hold the chip on the substrate.

The following example sets forth a specific processing sequence for carrying out the invention:

The individual dice (chips) (i.e., already cut from a wafer) were placed in a PECVD (plasma enhanced chemical vapor deposition) reactor. A thin film (2 μm) of silicon oxide was deposited onto the dice, covering both the top and sidewalls. A layer (1 μm) of amorphous silicon (a-Si) was deposited on top of the silicon oxide. The a-Si layer was etched to form vias to the underlying silicon oxide layer with a 514 nm beam from an argon-ion laser (4–7 mW/μm$^2$) in the presence of a chlorine ambient. The a-Si layer then acted as a mask for the RIE (reactive-ion-etching) of the silicon oxide, using $CHF_3/CF_4$ as the etchant gas mixture. The a-Si layer was removed with an $SF_6$ plasma after the silicon oxide etching was complete.

To prepare the sacrificial substrate for die attach, a 2–3 ml quantity of a 25% solution of phenoxy resin in cyclohexanone was poured onto the center of a 4 inch silicon wafer. A uniform coating of 3 μm was obtained by spinning the wafer at 200 rpm for 60 seconds. The wafer was dried at 125° C. for 30 minutes to drive off any remaining solvent.

To bond the dice to the release layer, the sacrificial substrate was placed on a hot plate and heated to 180° C. in an air ambient. The phenoxy resin release film softens significantly at this temperature but does not degrade. The dice were bonded to the softened phenoxy using a pick-and-place for accurate alignment with respect to the other bonded dice. A small force (1–2 psi) was applied to a die in order to create the desired fillet at the die/phenoxy interface. The wafer was removed from the hot plate to cool.

The sacrificial substrate with the dice attached to the release layer was coated with 500Å titanium, followed by 2000Å copper in a sputter deposition chamber. Shipley's PEPR-2400 photoresist was electroplated onto the copper layer. An argon-ion laser beam operating in the multiline UV between 333 nm and 370 nm was used to expose the resist. In order to expose the sidewalls of the dice, the laser beam was used at an angle of 30° to the horizontal. The resist was developed in 1% sodium carbonate in water, and copper was electroplated through the resist mask. The resist was stripped in 2% NaOH, and the 2000Å copper seed layer was etched with 10% ammonium persulfate in water. The titanium layer was removed in an $SF_6$ plasma.

To remove the dice from the release layer, the sacrificial substrate was placed in a container filled with n-methyl pyrolidone and heated to 150° C. for several hours. The dice slowly drifted off the substrate as the phenoxy film dissolved from under the die and gull wings.

Figure 10:
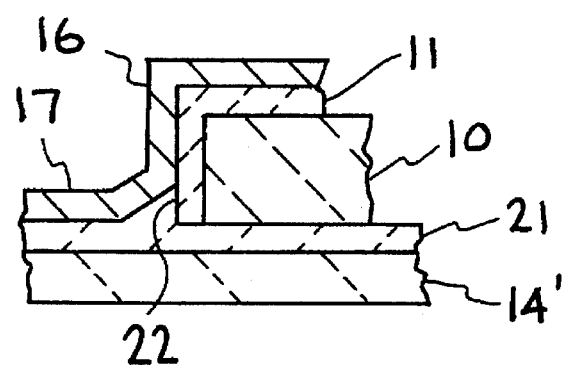
FIG. 10 is a cross-sectional view of the forming of the gull wing over a fillet formed in the polymer release layer which is on top of the sacrificial substrate.

The gull wings can be curved at the point of contact with the transmission lines, as shown in FIG. 10. Here the gull wings 17 are formed on a release layer 21, such as layer 14, in FIGS. 1–7, where the chip 10 is compressed into the layer 21 so as to displace some of the sacrificial material of the layer as indicated at 22, whereby the transmission line 16 does not extend to the bottom of chip 10, which produces a curved interconnection between gull wing 17 and line 16. The layer 21 in FIG. 10 may be composed of a release material such as 14 when located between the chip 10 and a sacrificial substrate 14' of FIG. 4 by which the substrate 14' is secured to chip 10.

It has thus been shown that the present invention provides for repairable high speed chip bonding/interconnect. The invention involves processes for forming a repairable, testable interconnection between a chip and a substrate utilizing gull wings type interconnects. The interconnect process is carried out by chip-to-sacrificial substrate fabrication. The process of this invention can be utilized effectively in electronic packaging, especially where at-speed testing of the chips may be required before assembly (such as for multichip modules or hybrid circuits), due to the repairability of the bonding/interconnect processes.

While specific operational sequences and approaches, materials, parameters, configurations, etc. have been illustrated and/or described to exemplify the invention, such are not intended to be limiting. Modifications and changes may become apparent to those skilled in the art, and it is intended that the invention be limited only by the scope of the appended claims.

The invention claimed is:

1. A process for producing repairable chip bonding/interconnects, comprising:

providing at least one passivated chip having at least one open contact on a surface thereof;

securing the chip to a substrate;

depositing a seed layer on at least a horizontal and a vertical surface of the chip and at least a horizontal surface of the substrate, said seed layer being in contact with the open contact of the chip;

patterning the seed layer by laser processing to form traces extending from the at least one contact on the chip to at least the horizontal surface of the substrate;

plating a metal on the patterned traces to form at least one transmission line terminating in a gull wing configuration, and removing exposed areas of the seed layer.

2. The process of claim 1, additionally including removing the at least one chip and the thus formed transmission line and gull wing from the substrate.

3. The process of claim 2, additionally including bonding the chip and thus formed transmission line and gull wing on another substrate.

4. The process of claim 1, additionally including passivating the at least one chip.

5. The process of claim 4, wherein passivation of the chip is carried out by depositing an oxide layer on the top and side surfaces thereof.

6. The process of claim 4, wherein passivation of the chip is carried out by depositing a layer of material selected from the group consisting of polyimide, silicon nitride, and parylene, thereby forming a dielectric passivation layer.

7. The process of claim 1, wherein securing of the at least one chip to the substrate is carried out by using a material which is dissolvable.

8. The process of claim 7, wherein the dissolvable material comprises a layer formed on at least one of the chip and substrate.

9. The process of claim 7, additionally including forming a layer of dissolvable material on both the chip and the substrate, and pressing the layers together to secure the chip to the substrate.

10. The process of claim 1, wherein the substrate is a sacrificial substrate, and additionally including removing the sacrificial substrate.

11. The process of claim 1, additionally including providing a layer of soluble material on the substrate prior to securing the at least one chip thereto.

12. The process of claim 11, wherein the layer of soluble material is formed from the group consisting of adhesives, polymers, and salts.

13. The process of claim 12, wherein the layer of soluble material is formed from the group consisting of phenoxy resin, polycarbonate, teflon, polyester, and polysulfone.

14. The process of claim 11, wherein securing the chip to the substrate is carried out by forming a layer of adhesion material on the adjacent surface of the chip, and pressing the adhesive material onto the layer of soluble material.

15. The process of claim 1, wherein the gull wings are formed to have a straight or curved configuration.

16. A process for forming interconnects including gull wings on a chip, comprising:

providing a passivated chip having a plurality of open contacts on a horizontal surface, forming a layer of soluble material on a substrate, forming a layer of adhesive material on a surface of the chip, bonding the chip to the substrate, depositing a seed layer on the horizontal surface of the chip so as to fill the open contacts thereon, on vertical surfaces of the chip, and on at least horizontal surfaces of the soluble layer, patterning traces on the chip and soluble layer to define areas for transmission lines and gull wings thereon, plating the traces to form the transmission lines and the gull wings, removing any exposed seed layer, and dissolving the soluble layer.

17. A process for forming transmission lines and gull wings on a chip, comprising:

depositing an oxide layer on horizontal and vertical surfaces of a chip, forming an opening in the oxide layer to provide open contacts on the chip, securing the chip to the substrate, depositing a seed layer on the chip, which fills the openings in the oxide layer, and on at least adjacent surfaces of the substrate.

patterning areas in the seed layer on the surfaces of the chip and the adjacent surfaces of the substrate, depositing metal on the patterned areas of the seed layer to form transmission lines and gull wings, removing exposed seed layer, and removing the substrate.

18. The process of claim 1, wherein securing the at least one chip to a substrate is carried out using a removable release layer which can be applied from a group consisting of a solution, a liquid, and a hot melt.

19. The process of claim 18, additionally including removing the chip from the substrate by dissolving the release layer.

* * * * *